(12) United States Patent
Lee

(10) Patent No.: US 12,733,495 B2
(45) Date of Patent: Sep. 8, 2026

(54) POWER MODULE INCLUDING MULTIPLE LAYERS HAVING VARIED COEFFICIENTS OF THERMAL EXPANSION AND THERMAL CONDUCTIVITIES

(71) Applicant: AMOSENSE CO., LTD., Cheonan-si (KR)

(72) Inventor: Jihyung Lee, Cheonan-si (KR)

(73) Assignee: AMOSENSE CO., LTD., Cheonan-si (KR)

( * ) Notice: Subject to any disclaimer, the term of this patent is extended or adjusted under 35 U.S.C. 154(b) by 431 days.

(21) Appl. No.: 18/022,256

(22) PCT Filed: Aug. 12, 2021

(86) PCT No.: PCT/KR2021/010703
§ 371 (c)(1),
(2) Date: Feb. 20, 2023

(87) PCT Pub. No.: WO2022/039441
PCT Pub. Date: Feb. 24, 2022

(65) Prior Publication Data

US 2023/0326828 A1 Oct. 12, 2023

(30) Foreign Application Priority Data

Aug. 19, 2020 (KR) ........................ 10-2020-0103896
Aug. 20, 2020 (KR) ........................ 10-2020-0104433

(51) Int. Cl.
*H10W 40/25* (2026.01)

(52) U.S. Cl.
CPC ................................ *H10W 40/255* (2026.01)

(58) Field of Classification Search
CPC ..... H01L 23/3735; H01L 23/15; H01L 23/13; H10W 40/255
See application file for complete search history.

(56) References Cited

U.S. PATENT DOCUMENTS

2004/0188828 A1* 9/2004 Nagatomo ............ C04B 35/645 257/E23.106
2016/0254210 A1* 9/2016 Idrac .................. H01L 23/3677 257/706

(Continued)

FOREIGN PATENT DOCUMENTS

JP H04-230063 A 8/1992
JP 4044449 B2 2/2008

(Continued)

OTHER PUBLICATIONS

KR Office Action dated Oct. 4, 2022 as received in Application No. 10-2020-0103896.

(Continued)

*Primary Examiner* — Lex H Malsawma
(74) *Attorney, Agent, or Firm* — Maschoff Brennan

(57) ABSTRACT

The present invention relates to a power module and a manufacturing method therefor, the power module comprising: a base plate having recessed grooves formed on the upper surface thereof; brazing filler layers arranged in the recessed grooves; and a ceramic substrate brazed to the upper surface of the base plate by means of the brazing filler layers. The present invention solves an existing soldering problem, enables reliable joining to various base plates, and can simplify processes.

15 Claims, 6 Drawing Sheets

(56) References Cited

U.S. PATENT DOCUMENTS

2018/0323122 A1* 11/2018 Kuromitsu ........... B23K 1/0016
2019/0051586 A1 2/2019 Park et al.
2019/0131208 A1* 5/2019 Feichtinger ....... H01L 23/49833

FOREIGN PATENT DOCUMENTS

JP 5050633 B2 10/2012
JP 2016042538 A * 3/2016
JP 6331867 B2 5/2018
JP 6572732 B2 9/2019
KR 10-2013-0093957 A 8/2013

OTHER PUBLICATIONS

KR Office Action dated Oct. 4, 2022 as received in Application No. 10-2020-0104433.
KR Office Action dated Feb. 3, 2024 as received in Application No. 10-2023-0080727.

* cited by examiner

[FIG. 1]
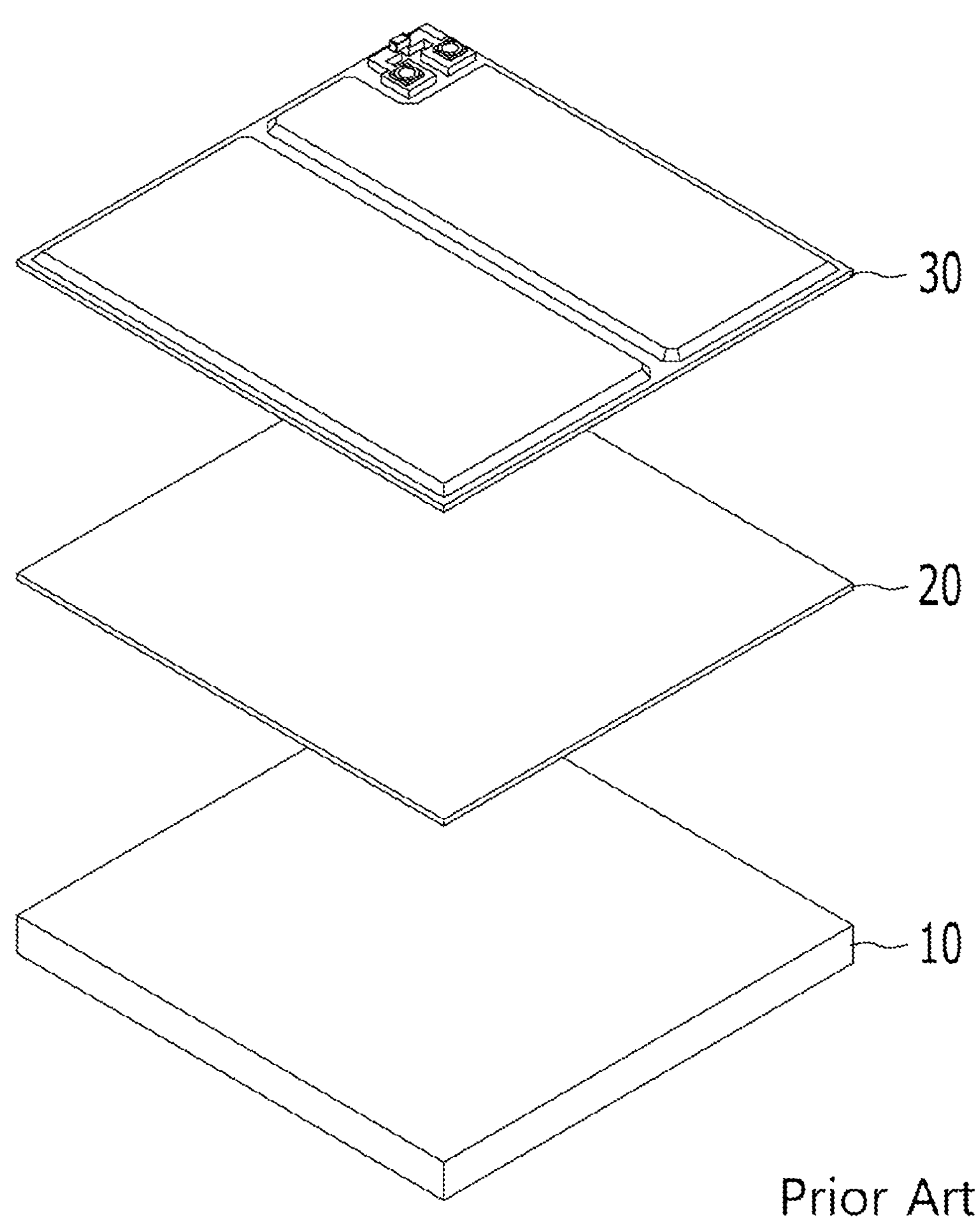

[FIG. 2]
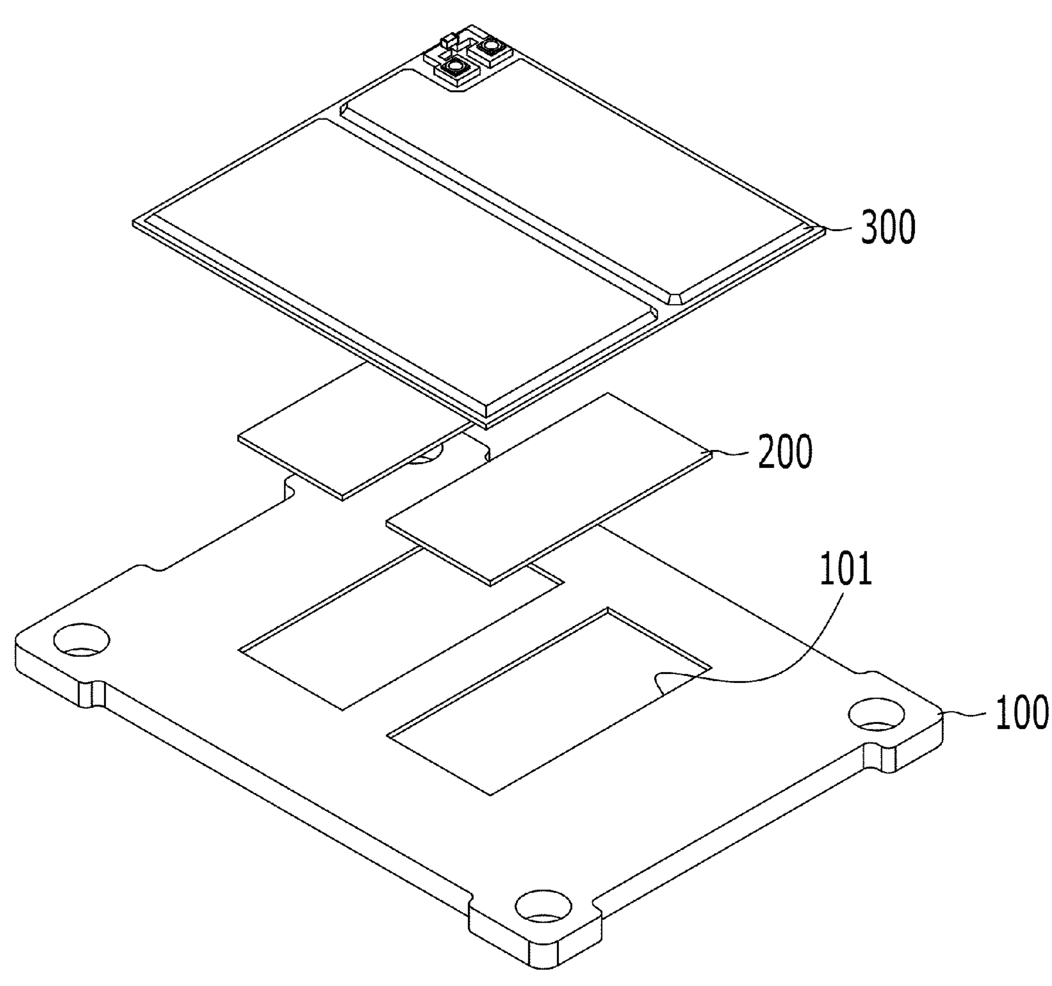

[FIG. 3]
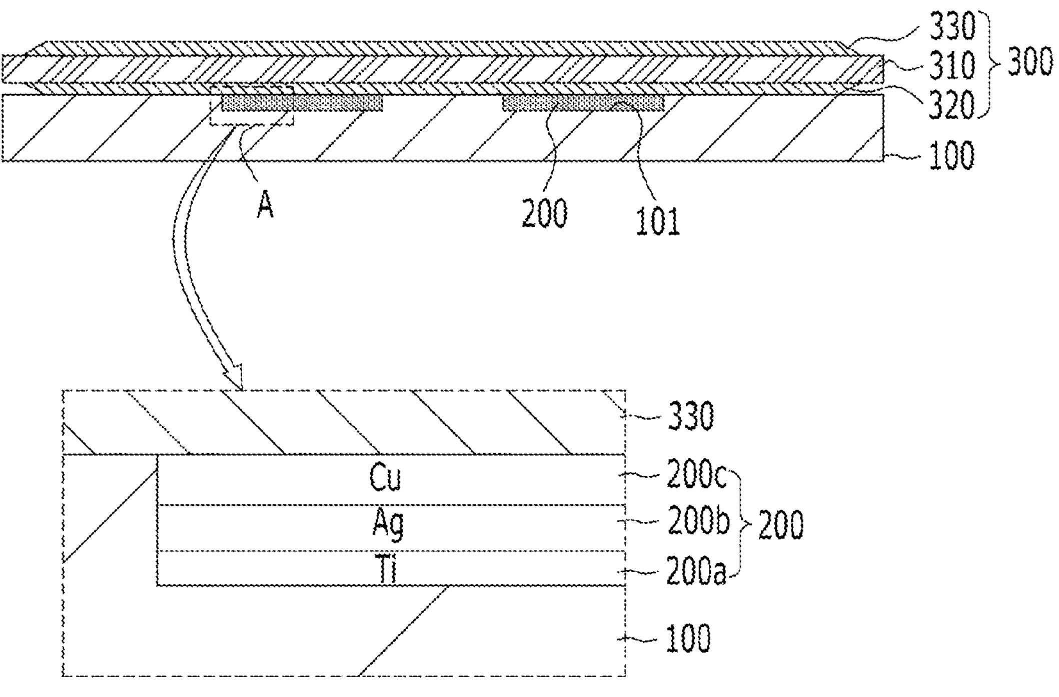
[FIG. 4]
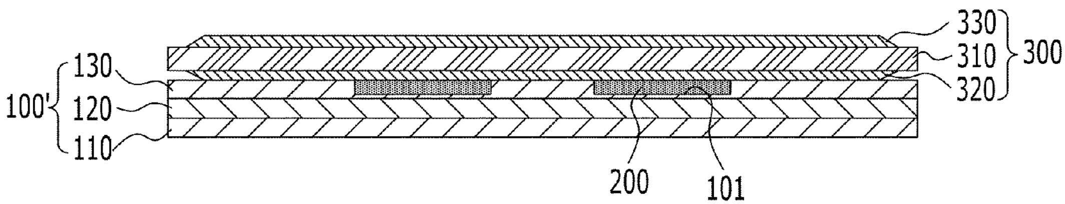

[FIG. 5]
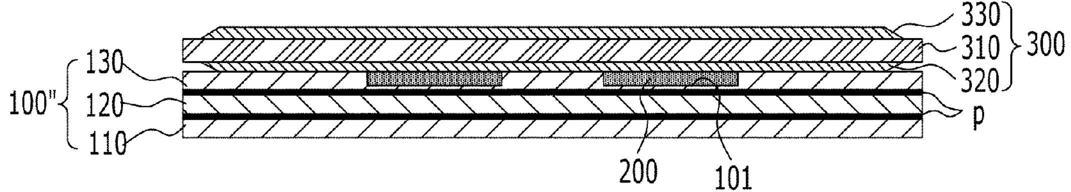
[FIG. 6]
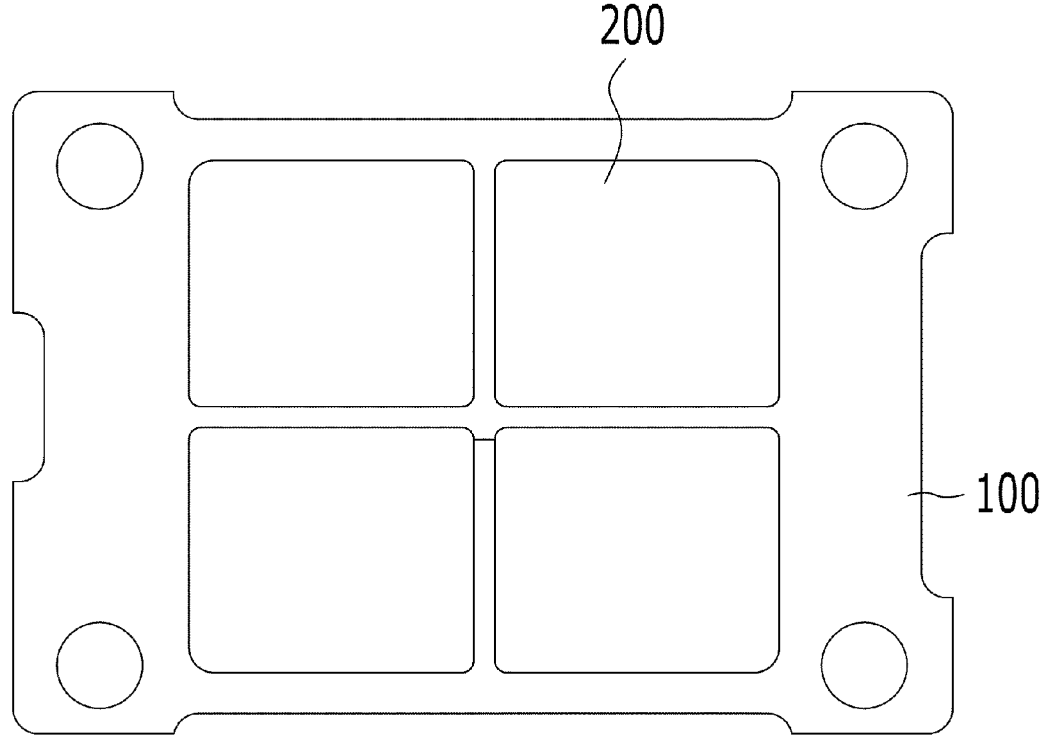

[FIG. 7]
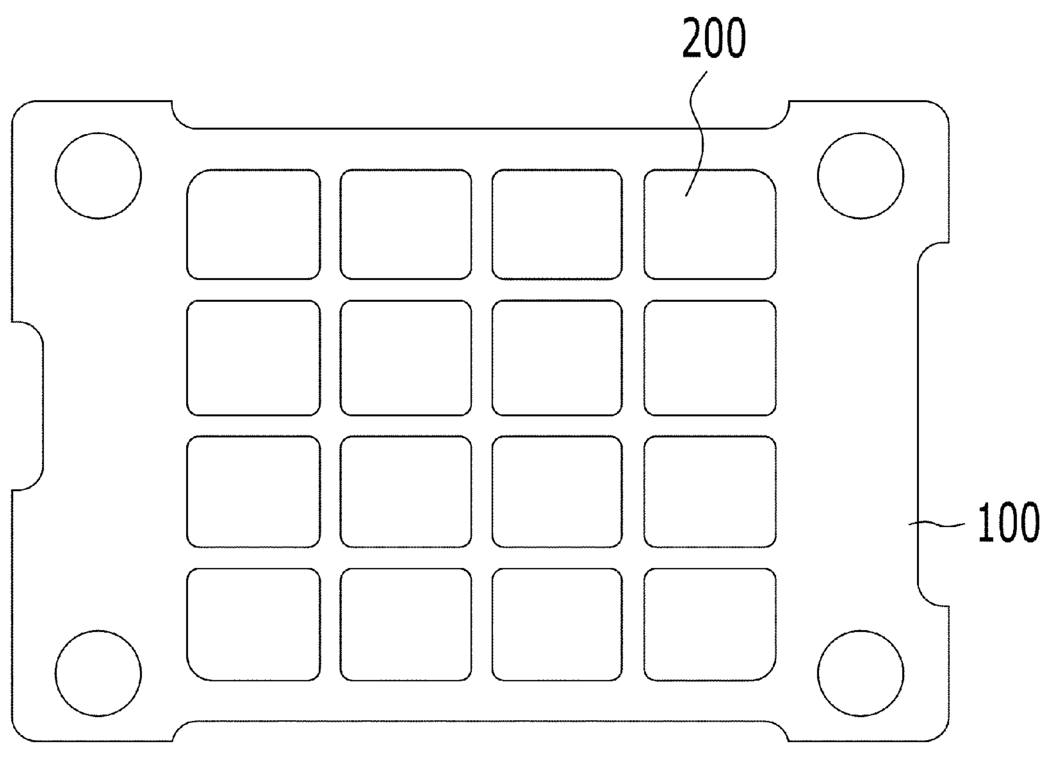

[FIG. 8]
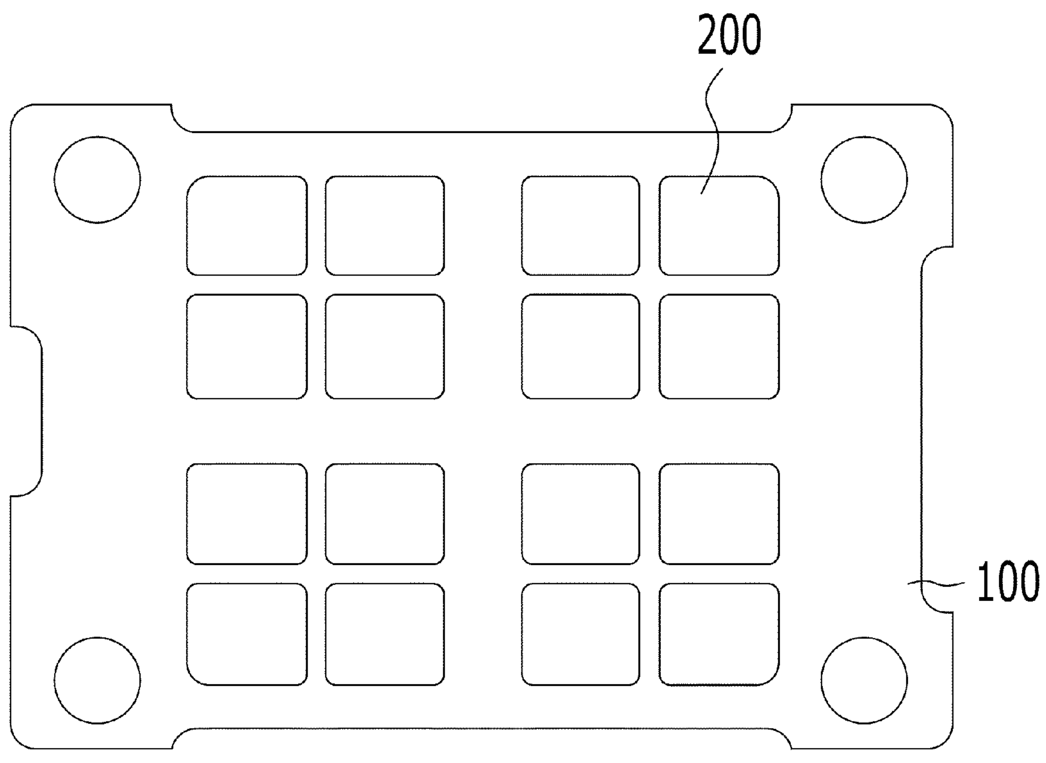

POWER MODULE INCLUDING MULTIPLE LAYERS HAVING VARIED COEFFICIENTS OF THERMAL EXPANSION AND THERMAL CONDUCTIVITIES

TECHNICAL FIELD

The present disclosure relates to a power module and a manufacturing method therefor. More particularly, the present disclosure relates to a power module having a bonding structure between a base plate and a ceramic substrate that can effectively dissipate heat generated from a high-power semiconductor chip, and to a manufacturing method therefor.

BACKGROUND ART

In general, a base plate is formed in a quadrangular plate shape and is made of aluminum or copper. The base plate may be bonded to a lower surface of a ceramic substrate and used as a heat dissipation plate. The bonding of the base plate to the lower surface of the ceramic substrate is achieved by soldering or using silver (Ag) paste with high thermal conductivity to facilitate heat dissipation.

However, in the case of using a large-area base plate and ceramic substrate, a large bonding area and a difference in coefficient of thermal expansion may cause the base plate to experience warpage. In addition, the silver paste may melt at a high operating temperature, causing warpage or defects of the base plate. In the case of copper, warpage may occur at a temperature of equal to or higher than 200° C. due to the material properties of copper.

As a solution to this, it is conceivable to bond the ceramic substrate and the base plate together with AlSiC or a similar material at a temperature of equal to or less than 250° C.

FIG. 1 illustrates a conventional bonding structure between a base plate and a ceramic substrate.

As illustrated in FIG. 1, a base plate 10 is bonded to a ceramic substrate 30 by soldering via a solder preform 20. The base plate 10 is made of CuMo or Ni—Au material. As the solder preform 20, SAC305 made of a composition including Sn, Ag, and Cu, is used. The soldering temperature is in the range of 230° C. to 350° C.

However, in the conventional bonding structure between the base plate 10 and the ceramic substrate 30 illustrated in FIG. 1, solder paste, solder preform, and vacuum bonding equipment used for the bonding process increases process costs and cause problems in bonding reliability and yield.

DISCLOSURE

Technical Problem

Accordingly, the present disclosure has been made keeping in mind the above problems occurring in the related art, and an objective of the present disclosure is to provide a power module capable of improving bonding reliability between a base plate and a ceramic substrate, enabling highly reliable bonding of various base plates, simplifying processes, and reducing process costs, and to provide a manufacturing method therefor.

Technical Solution

In order to accomplish the above objective, according to one aspect of the present disclosure, there is provided a power module including: a base plate having a recess on an upper surface thereof; a brazing filler layer disposed in the recess; and a ceramic substrate bonded to the upper surface of the base plate by brazing via the brazing filler layer.

The base plate may have a multi-layer structure.

The base plate may be made of at least one of Cu, Al, AlSiC, CuMo, CuW, Cu/CuMo/Cu, Cu/Mo/Cu, and Cu/W/Cu, or a composite material thereof.

The recess may include a plurality of recesses.

The recess may have a height equal to or smaller than a thickness of the brazing filler layer.

The brazing filler layer may be made of an alloy material including AgCu or AgCuTi.

The brazing filler layer may have a thickness in a range of 5 to 100 nm.

The ceramic substrate may include a ceramic base and a plurality of metal layers on upper and lower surfaces of the ceramic base, and the metal layers may be made of one of Cu, a Cu alloy, OFC, EPT Cu, and Al.

According to another aspect of the present disclosure, there is provided a power module including: a base plate; a brazing filler layer disposed on an upper surface of the base plate; and a ceramic substrate bonded to the upper surface of the base plate by brazing via the brazing filler layer. The brazing filler layer may include a plurality of brazing filler layers that are divided and arranged on the upper surface of the base plate.

The plurality of brazing filler layers may be divided and arranged in any one of a 2×1 array, a 2×2 array, and a 4×4 array, and the plurality of brazing filler layers may have the same areas.

The plurality of brazing filler layers may be arranged in a matrix on the upper surface of the base plate and spaced apart from each other by a predetermined distance.

The plurality of brazing filler layers may have a volume in a range of 85% to 115% of a volume of a metal layer on a lower surface of the ceramic substrate.

The base plate may have a plurality of recesses in which the plurality of brazing filler layers are disposed.

Each of the plurality of brazing filler layers may be made of an alloy material including AgCu or AgCuTi.

Each of the plurality of brazing filler layers may have a thickness in a range of 5 to 100 μm.

The base plate may be made of at least one of Cu, Al, AlSiC, CuMo, CuW, Cu/CuMo/Cu, Cu/Mo/Cu, and Cu/W/Cu, or a composite material thereof.

According to still another aspect of the present disclosure, there is provided a method of manufacturing a power module, the method including: preparing a base plate having a recess on an upper surface thereof; preparing a ceramic substrate; disposing a brazing filler layer in the recess; and stacking the ceramic substrate on the upper surface of the base plate on which the brazing filler layer is disposed and then performing brazing.

In the preparing of the base plate having the recess on the upper surface thereof, the recess may be formed by half-etching the base plate.

In the disposing of the brazing filler layer in the recess, a brazing filler layer having a thickness in a range of 5 to 100 μm may be disposed in the recess by any one method of paste application, foil attachment, and P-filler.

In the performing of the brazing, the brazing may be performed at a temperature in a range of 780° C. to 900° C., and a weight or pressure may be applied during the brazing.

According to still another aspect of the present disclosure, there is provided a method of manufacturing a power module, the method including: preparing a base plate having a plurality of recesses on an upper surface thereof; preparing a ceramic substrate; disposing a brazing filler layer in each of the plurality of recesses; and stacking the ceramic substrate on the upper surface of the base plate on which the respective brazing filler layers are disposed and then performing brazing.

Advantageous Effects

According to the present disclosure, by bonding a base plate to a ceramic substrate by brazing, bonding strength can be increased. Also, since brazing does not require vacuum bonding equipment such as solder preforms, processes can be simplified. In addition, by applying a weight or pressure during brazing, pore defects can be prevented and bonding strength can be increased, thereby increasing bonding reliability.

Thus, the present disclosure solves an existing soldering problem and enables reliable bonding of various base plates. Furthermore, by using a warpage control method based on the coefficient of thermal expansion for each material, the base plate can be bonded to the ceramic substrate without being warped.

In addition, by applying a base plate of a multilayer structure in which different materials are bonded together, the base plate can be manufactured to have a thickness favorable for heat dissipation and a low coefficient of thermal expansion. Thus, the base plate can be prevented from warpage at high temperatures when applied to a large area.

In addition, since a brazing filler layer of the present disclosure can facilitate the movement of heat and quickly transfer heat of the ceramic substrate to the base plate, thereby maximizing the heat dissipation effect.

DESCRIPTION OF DRAWINGS

FIG. 1 is a view illustrating a conventional bonding structure between a base plate and a ceramic substrate.

FIG. 2 is an exploded perspective view illustrating a bonding structure between a base plate for a power module and a ceramic substrate according to an embodiment of the present disclosure.

FIG. 3 is a sectional view illustrating the bonding structure between the base plate for the power module and the ceramic substrate according to the embodiment of the present disclosure.

FIG. 4 is a sectional view illustrating a bonding structure between a base plate for a power module and a ceramic substrate according to another embodiment of the present disclosure.

FIG. 5 is a sectional view illustrating a bonding structure between a base plate for a power module and a ceramic substrate according to still another embodiment of the present disclosure.

FIGS. 6 to 8 are plan views illustrating a brazing filler layer disposed on a base plate for a power module according to still another embodiment of the present disclosure.

DESCRIPTION OF THE REFERENCE NUMERALS IN THE DRAWINGS

100: base plate 101: recess
200: brazing filler layer 200*a*: Ti layer
200*b*: Ag layer 200*c*: Cu layer
300: ceramic substrate 310: ceramic base
320 and 330: metal layer 100': base plate
110: first metal sheet 120: second metal sheet
130: third metal sheet p: brazing filler layer

MODE FOR INVENTION

Hereinafter, exemplary embodiments of the present disclosure will be described in detail with reference to the accompanying drawings.

Since the present disclosure is characterized by a bonding structure between a base plate and a ceramic substrate among the components included in a power module, this will be mainly described.

FIG. 2 is an exploded perspective view illustrating a bonding structure between a base plate for a power module and a ceramic substrate according to an embodiment of the present disclosure. FIG. 3 is a sectional view illustrating the bonding structure between the base plate for the power module and the ceramic substrate according to the embodiment of the present disclosure.

As illustrated in FIGS. 2 and 3, a power module according to the present disclosure includes a base plate 100, a brazing filler layer 200, and a ceramic substrate 300.

In the power module, a high-power semiconductor chip is interposed between two ceramic substrates arranged vertically. Each of the two ceramic substrates includes a ceramic substrate and a metal layer bonded to at least one surface of the ceramic substrate by brazing so as to increase heat dissipation efficiency of the semiconductor chip. The semiconductor chip may be a Si, SiC, or GaN semiconductor chip. The ceramic substrate 310 may be made of, for example, one of alumina ($Al_2O_3$), AlN, SiN, and $Si_3N_4$. The metal layers 320 and 330 may be made of, for example, one of Cu, a Cu alloy, OFC, EPT Cu, and Al. Here, OFC is oxygen-free copper.

The base plate 100 is bonded to a lower surface of the lowermost ceramic substrate 300 and used as a heat dissipation plate for dissipating heat generated from the semiconductor chip.

The base plate 100 may be formed in a quadrangular plate shape having a predetermined thickness. The base plate 100 is made of a material capable of increasing heat dissipation efficiency. The base plate 100 may be made of, for example, at least one of Cu, Al, AlSiC, CuMo, CuW, Cu/CuMo/Cu, Cu/Mo/Cu, and Cu/W/Cu, or a composite material thereof. Cu, Al, AlSiC, CuMo, CuW, Cu/CuMo/Cu, Cu/Mo/Cu and Cu/W/Cu materials have excellent thermal conductivity, and AlSiC, CuMo, CuW, Cu/CuMo/Cu, Cu/Mo/Cu, and Cu/W/Cu materials have a low coefficient of thermal expansion. Due to these material properties, the base plate 100 is prevented from warpage when bonded to the ceramic substrate 300.

The base plate 100 has a recess 101 depressed downwardly from an upper surface thereof. The recess 101 is to allow the brazing filler layer 200 to be disposed therein to improve the bonding characteristics between the base plate 100 and the ceramic substrate 300. The recess 101 is formed in a predetermined area on the upper surface of the base plate 100. A plurality of recesses 101 are formed. In an embodiment, two recesses 101 are formed in predetermined areas on the upper surface of the base plate 100.

The brazing filler layer 200 is disposed in the each of the recesses 101 of the base plate 100. The brazing filler layer 200 is to secure the bonding characteristics between the base plate 100 and the ceramic substrate 300. The base plate 100 and the ceramic substrate 300, may be bonded together by soldering. However, soldering has the drawback of low bonding reliability resulting from voids generated between the base plate 100 and the ceramic substrate 300 when the base plate 100 is warped at high temperatures.

The brazing filler layer 200 has a thickness in the range of 5 to 100 μm.

The brazing filler layer 200 may be a thin film having a multi-layer structure. The thin film having a multi-layer structure is to compensate for insufficient performance and increase bonding strength. The brazing filler layer 200 may be made of an alloy material including at least one of Ag, Cu, AgCu, and AgCuTi. Ag and Cu increase bonding strength due to their high thermal conductivity, and at the same time increase heat dissipation efficiency by facilitating heat transfer between the ceramic substrate 300 and the base plate 100. Ti facilitates attachment of Ag and Cu to the base plate 100 due to its good wettability.

For example, the brazing filler layer 200 may have a two-layer structure including an Ag layer and a Cu layer on the Ag layer. Alternatively, the brazing filler layer 200 may have a three-layer structure including a Ti layer 200*a*, an Ag layer 200*b* on the Ti layer 200*a*, and a Cu layer 200*c* on the Ag layer 200*b*.

The height of the recess 101 in which the brazing filler layer 200 is disposed is equal to or smaller than the thickness of the brazing filler layer 200. Making the height of the recess 101 equal to or smaller than the thickness of the brazing filler layer 200 enables the brazing filler layer 200 to bond the base plate 100 and the ceramic substrate 300.

The brazing filler layer 200 is used for bonding the base plate 100 and the ceramic substrate 300. After brazing, the boundary of the brazing filler layer 200 may become ambiguous.

In an embodiment, the recesses 101 are formed in predetermined areas on the upper surface of the base plate 100, the brazing filler layer 200 is disposed in each of the recesses 101, and then the base plate 100 and the ceramic substrate 300 are bonded by brazing. Alternatively, the brazing filler layer 200 may be disposed on the upper surface of the base plate 100 without forming the recesses 101, and then the base plate 100 and the ceramic substrate 300 may be bonded by brazing. In the former case in which the base plate 100 and the ceramic substrate 300 are bonded by brazing after forming the recesses 101 on the upper surface of the base plate 100 and disposing the brazing filler layer 200 in each of the recesses 101, the bonding strength is better due to an increased contact area.

Meanwhile, a manufacturing method for a power module according to an embodiment of the present disclosure includes: preparing a base plate 100 having a recess 101 on an upper surface thereof; preparing a ceramic substrate 300; disposing a brazing filler layer 200 in the recess 101; and stacking the ceramic substrate 300 on the upper surface of the base plate 100 on which the brazing filler layer 200 is disposed and then performing brazing.

In the step of preparing the base plate 100 having the recess 101 on the upper surface thereof, the recess 101 is formed by half-etching the base plate 100. As the base plate 100, a plate made of at least one of Cu, Al, AlSiC, CuMo, CuW, Cu/CuMo/Cu, Cu/Mo/Cu, and Cu/W/Cu, or a composite material thereof is prepared. Preferably, as the base plate 100, a plate made of, at least one of AlSiC, CuMo, CuW, Cu/CuMo/Cu, Cu/Mo/Cu, and Cu/W/Cu, or a composite material thereof is prepared. AlSiC, CuMo, CuW, Cu/CuMo/Cu, Cu/Mo/Cu, and Cu/W/Cu materials have a lower coefficient of thermal expansion than Cu and Al. Due to these material properties, warpage caused by the difference in coefficient of thermal expansion at high temperatures is prevented.

The base plate 100 may have a thickness in the range of 1.0 to 3.0 mm. Preferably, the base plate 100 has a thickness of equal to or greater than 2.0 mm to be advantageous for heat dissipation and prevent warpage.

In the step of preparing the ceramic substrate 300, a ceramic substrate 300 including a ceramic base 310 and a plurality of metal layers 320 and 330 bonded to at least one surface of the ceramic base 310 by brazing is prepared. As the ceramic substrate 300, for example, any one of an AMB substrate, a DBC substrate, a TPC substrate, and a DBA substrate is prepared.

In the step of disposing the brazing filler layer 200 in the recess 101, a brazing filler layer 200 having a thickness in the range of 5 to 100 μm is disposed in the recess 101 by any one method of paste application, foil attachment, and P-filler.

The brazing filler layer 200 may be made of an alloy material including AgCu or AgCuTi.

In the step of performing brazing, brazing is performed at a temperature of equal to or higher than 450° C., preferably in the range of 780° C. to 900° C. During brazing, a weight or pressure is applied to increase bonding strength.

For example, in the step of performing brazing, a laminate of first to third metal sheets 110, 120, and 130 is prepared by disposing the second metal sheet 120 on the first metal sheet 110 on which a brazing filler layer p is formed and then disposing the third metal sheet 130 on the second metal sheet 120 on which a brazing filler layer p is formed. After that, the laminate is disposed between upper and lower pressing jigs in a brazing furnace and pressed from the top and bottom during heating.

Alternatively, the laminate is disposed in the brazing furnace, and a weight body is disposed on the upper surface of the laminate to press the laminate from the top. Applying the weight or pressure in the step of performing brazing is to achieve bonding without voids.

The heating temperature of the brazing furnace is controlled to equal to or higher than 780° C., preferably in the range of 780° C. to 900° C., so that brazing is performed efficiently. A preferred brazing temperature is, for example, 870° C.

Since brazing does not require vacuum bonding equipment such as solder preforms, processes are simplified. Also, since applying the weight or pressure during brazing prevents pore defects and increases bonding strength, bonding reliability is increased.

After the step of performing brazing, the base plate 100 is integrated with the metal layer 320 of the ceramic substrate 300.

In the above-described embodiment, the base plate 100 has a single-layer structure. However, the present disclosure is not limited thereto, and the base plate 100 may have a multi-layer structure to have a low coefficient of thermal expansion (low CTE).

FIG. 4 is a sectional view illustrating a bonding structure between a base plate for a power module and a ceramic substrate according to another embodiment of the present disclosure. FIG. 5 is a sectional view illustrating a bonding structure between a base plate for a power module and a ceramic substrate according to still another embodiment of the present disclosure. The other embodiment and the still other embodiment are different from the above-described embodiment in that a base plate has a multi-layer structure.

As illustrated in FIG. 4, a base plate 100' may be formed in a multi-layer structure of three or more layers. For example, the base plate 100 may be formed by stacking metal sheets of different materials and may have a thickness of equal to or greater than 10 mm to be advantageous for heat dissipation and prevent warpage.

The base plate 100' includes a first metal sheet 110, a second metal sheet 120, and a third metal sheet 130. The base plate 100 has a three-layer structure in which the second metal sheet 120 is formed on the first metal sheet 110 and the third metal sheet 130 is formed on the second metal sheet 120.

The first metal sheet 110 and the third metal sheet 130 are made of the same metal material, and the second metal sheet 120 is made of a different metal material from the first metal sheet 110 and the third metal sheet 130. Preferably, the second metal sheet 120 is made of a metal material having a low coefficient of thermal expansion, and the first metal sheet 110 and the third metal sheet 130 are made of a metal material having excellent thermal conductivity. A base plate having a low thermal expansion coefficient may be manufactured by bonding the first metal sheet 110 and the third metal sheet 130 made of a metal material having excellent thermal conductivity to upper and lower surfaces of the second metal sheet 120 made of a metal material having a low coefficient of thermal expansion.

For example, the first metal sheet 110 may be a Cu metal sheet, the second metal sheet 120 may be a CuMo metal sheet, and the third metal sheet 130 may be a Cu metal sheet. Alternatively, the first metal sheet 110 may be a Cu metal sheet, the second metal sheet 120 may be a Mo metal sheet, and the third metal sheet 130 may be a Cu metal sheet. Alternatively, the first metal sheet 110 may be a Cu metal sheet, the second metal sheet 120 may be a W metal sheet, and the third metal sheet 130 may be a Cu metal sheet.

In the base plate 100' having a three-layer metal sheet structure of Cu/CuMo/Cu in which the first metal sheet 110 is a Cu metal sheet, the second metal sheet 120 is a CuMo metal sheet, and the third metal sheet 130 is a Cu metal sheet, CuMo is for preventing warpage due to its low coefficient of thermal expansion, and Cu is for securing thermal conductivity for heat dissipation.

That is, since the base plate 100' is formed in a three-layer metal sheet structure in which Cu metal sheets having a relatively high coefficient of thermal expansion but high thermal conductivity are bonded to upper and lower surfaces of a CuMo metal sheet having a relatively low coefficient of thermal expansion, the CuMo metal sheet absorbs warpage of the Cu metal sheet to reduce warpage caused by the difference in coefficient of thermal expansion at high temperatures.

The base plate 100' having a three-layer structure of Cu/CuMo/Cu may be formed by coating a Cu layer on the upper and lower surfaces of the CuMo metal sheet by infiltrating the CuMo metal sheet into molten metal, and then performing rolling.

On the other hand, as illustrated in FIG. 5, a base plate 100" may have a three-layer structure in which a second metal sheet 120 is bonded to an upper surface of a first metal sheet 110, and a third metal sheet 130 is bonded to an upper surface of the second metal sheet 120. Forming a multi-layer structure by bonding the first metal sheet 110, the second metal sheet 120, and the third metal sheet 130 enables the base plate 100" to be manufactured with a desired thickness without limiting the thickness.

The base plate 100" may have a three-layer structure in which the second metal sheet 120 is bonded to the upper surface of the first metal sheet 110 by brazing via a brazing filler layer 200, and the third metal sheet 130 is bonded to the upper surface of the second metal sheet 120 by brazing via a brazing filler layer 200.

The brazing filler layer 200 may be made of an alloy material including AgCu or AgCuTi. For example, the brazing filler layer 200 may have a two-layer structure including an Ag layer and a Cu layer on the Ag layer. Alternatively, the brazing filler layer 200 may have a three-layer structure including a Ti layer 200*a*, an Ag layer 200*b* on the Ti layer 200*a*, and a Cu layer 200*c* on the Ag layer 200*b*.

In addition, a base plate 100" with a thickness of equal to or greater than 2.0 mm may be manufactured by bonding Cu metal sheets to upper and lower surfaces of a CuMo metal sheet via brazing filler layers p to form a three-layer structure or a multi-layer structure.

According to experimental results, when the base plate 100" is formed in a three-layer metal sheet structure of Cu/CuMo/Cu or made of AlSiC, the best bonding characteristics were exhibited in bonding to a ceramic substrate 300. At this time, the coefficient of thermal expansion was 6.8 to 12 ppm/K, and the thermal conductivity was 220 to 280 W/m·K.

The present disclosure described above helps to increase bonding reliability, simplify processes, and reduce process costs since the base plate and the ceramic substrate are bonded together by brazing at a high temperature.

In particular, since brazing does not require vacuum bonding equipment such as solder preforms, manufacturing processes are simplified. Also, by applying the weight or pressure during brazing, pore defects are prevented and bonding strength is increased, thereby increasing bonding reliability.

In addition, the base plate is prevented from warpage at high temperatures due to its low coefficient of thermal expansion, and satisfies high heat dissipation conditions required by a power module due to its excellent thermal conductivity.

In still another embodiment, a brazing filler layer on an upper surface of a base plate may be disposed in the form of a divided pattern.

FIGS. 6 to 8 are plan views illustrating a brazing filler layer disposed on a base plate for a power module according to still another embodiment of the present disclosure.

As illustrated in FIGS. 6 to 8, a plurality of brazing filler layers 200 may be divided and arranged on an upper surface of a base plate 100. Dividing and arranging the brazing filler layers 200 on the upper surface of the base plate 100 enables an amount of change in warpage to be controlled.

The plurality of brazing filler layers 200 may be divided and arranged in any one of a 2×1 array, a 2×2 array (see FIG. 6), and a 4×4 array (see FIGS. 7 and 8). In addition, it is preferable that the plurality of brazing filler layers 200 have the same areas to provide a uniform bonding area.

In addition, it is preferable that the plurality of brazing filler layers 200 are arranged in a matrix on the upper surface of the base plate 100 and spaced apart from each other by a predetermined distance.

In addition, it is preferable that the plurality of brazing filler layers 200 have a volume in the range of 85% to 115% of the volume of a metal layer 320 on a lower surface of a ceramic substrate (300 in FIG. 3). The volume of the plurality of brazing filler layers 200 means bonding area× height.

The base plate 100 has a plurality of recesses 101 in which the plurality of brazing filler layers 200 are disposed. Forming the recesses 101 on the upper surface of the base plate 100 in the form of a divided pattern and disposing the brazing filler layers 200 in the recesses 101 facilitates uniform arrangement of the brazing filler layers 200 and improves bonding strength.

The divided pattern of the brazing filler layers 200 may be designed after calculating the amount of change in warpage of the base plate 100 in advance by calculating the coefficient of thermal expansion and the bonding area or volume of the base plate 100. More specifically, the bonding area and volume of the base plate 100 may be calculated by calculating the area ratio or volume part of a metal layer 320 of a ceramic substrate 300, and then the divided pattern of the brazing filler layers 200 in which warpage of the base plate 100 does not occur may be calculated in the range of 85% to 115%.

To control the amount of change in warpage, the base plate 100 may be made of, for example, at least one of Cu, Al, AlSiC, CuMo, CuW, Cu/CuMo/Cu, Cu/Mo/Cu, and Cu/W/Cu, or a composite material thereof.

When designing the divided pattern of the brazing filler layers 200 on the upper surface of the base plate 100, a manufacturing method for a power module according to another embodiment of the present disclosure includes: preparing a base plate 100 having a plurality of recesses 101 divided and arranged on an upper surface thereof; preparing a ceramic substrate 300; disposing a brazing filler layer 200 in each of the plurality of recesses 101; and stacking the ceramic substrate 300 on the upper surface of the base plate 100 on which the respective brazing filler layers 200 are disposed and then performing brazing.

In the step of preparing the base plate 100 having the plurality of recesses 101 divided and arranged on the upper surface thereof, the recesses 101 are formed by half-etching the base plate 100.

In the step of disposing the brazing filler layer 200 in each of the recesses 101, a brazing filler layer 200 having a thickness in the range of 5 to 100 μm is disposed in each of the recesses 101 by any one method of paste application, foil attachment, and P-filler.

The brazing filler layer 200 may be made of an alloy material including AgCu or AgCuTi.

In the step of performing brazing, brazing is performed at a temperature in the range of 780° C. to 900° C. During brazing, a weight or pressure is applied.

The present disclosure described above helps to increase bonding reliability, simplify processes, and reduce process costs since the base plate and the ceramic substrate are bonded together by brazing at a high temperature.

In particular, since brazing does not require vacuum bonding equipment such as solder preforms, processes are simplified. Also, by applying the weight or pressure during brazing, pore defects are prevented and bonding strength is increased, thereby increasing bonding reliability.

In addition, the base plate is prevented from warpage at high temperatures due to its low coefficient of thermal expansion, and satisfies high heat dissipation conditions required by a power module due to its excellent thermal conductivity.

Although the bonding structure of the base plate and the ceramic substrate described above has been described as being applied to a power module as an example, it can be applied to various bonding structures that require highly reliable bonding.

While the embodiments of the present disclosure have been separately described for ease of explanation, it is also possible to implement new embodiments by combining the embodiments.

As described above, the best embodiments of the present disclosure have been illustrated and described in detail. Although specific terms have been employed, they are used in a generic and descriptive sense only and not for purposes of limitation, the scope of the present disclosure being defined in the claims. Therefore, those of skill in the art will be appreciate that various modifications, additions, and substitutions are possible, without departing from the scope and spirit of the present disclosure. The patent right of the present disclosure should be defined by the scope and spirit of the present disclosure as disclosed in the accompanying claims.

The invention claimed is:

1. A power module comprising:

a base plate having a recess on an upper surface thereof;

a brazing filler layer disposed in the recess; and a ceramic substrate bonded to the upper surface of the base plate by brazing via the brazing filler layer, wherein the base plate has a three-layer structure in which a second metal sheet is disposed between a first metal sheet and a third metal sheet, and the first metal sheet and the third metal sheet being formed of a metal material having a higher coefficient of thermal expansion and thermal conductivity than the second metal sheet, wherein the first metal sheet, the second metal sheet, and the third metal sheet have the same area, and wherein the second metal sheet is interposed between the first metal sheet and the third metal sheet so as to overlap an entire area of each of the first metal sheet and the third metal sheet.

2. The power module of claim 1, wherein the first metal sheet and the third metal sheet of the base plate are made of Cu, and the second metal sheet is made of any one of CuMo, Mo, and W.

3. The power module of claim 1, wherein the recess comprises a plurality of recesses.

4. The power module of claim 1, wherein the recess has a height equal to or smaller than a thickness of the brazing filler layer.

5. The power module of claim 1, wherein the brazing filler layer is made of an alloy material including AgCu or AgCuTi.

6. The power module of claim 1, wherein the brazing filler layer has a thickness in a range of 5 to 100 μm.

7. The power module of claim 1, wherein the ceramic substrate includes a ceramic base and a plurality of metal layers on upper and lower surfaces of the ceramic base, and the metal layers are made of one of Cu, a Cu alloy, OFC, EPT Cu, and Al.

8. A power module comprising:

a base plate;

a brazing filler layer disposed on an upper surface of the base plate; and a ceramic substrate bonded to the upper surface of the base plate by brazing via the brazing filler layer, wherein the brazing filler layer comprises a plurality of brazing filler layers that are divided and arranged on the upper surface of the base plate, wherein the base plate has a three-layer structure in which a second metal sheet is disposed between a first metal sheet and a third metal sheet, and the first metal sheet and the third metal sheet being formed of a metal material having a higher coefficient of thermal expansion and thermal conductivity than the second metal sheet, wherein the first metal sheet, the second metal sheet, and the third metal sheet have the same area, and wherein the second metal sheet is interposed between the first metal sheet and the third metal sheet so as to overlap an entire area of each of the first metal sheet and the third metal sheet.

9. The power module of claim 8, wherein the plurality of brazing filler layers are divided and arranged in any one of a 2×1 array, a 2×2 array, and a 4×4 array, and the plurality of brazing filler layers have the same areas.

10. The power module of claim 8, wherein the plurality of brazing filler layers are arranged in a matrix on the upper surface of the base plate and spaced apart from each other by a predetermined distance.

11. The power module of claim 8, wherein the plurality of brazing filler layers have a volume in a range of 85% to 115% of a volume of a metal layer on a lower surface of the ceramic substrate.

12. The power module of claim 8, wherein the base plate has a plurality of recesses in which the plurality of brazing filler layers are disposed.

13. The power module of claim 8, wherein each of the plurality of brazing filler layers is made of an alloy material including AgCu or AgCuTi.

14. The power module of claim 8, wherein each of the plurality of brazing filler layers has a thickness in a range of 5 to 100 μm.

15. The power module of claim 8, wherein the first metal sheet and the third metal sheet of the base plate are made of Cu, and the second metal sheet is made of any one of CuMo, Mo, and W.

* * * * *